(12) United States Patent
Kim

(10) Patent No.: US 7,691,548 B2
(45) Date of Patent: Apr. 6, 2010

(54) METHOD OF MANUFACTURING MASK

(75) Inventor: Seong-yoon Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/222,987

(22) Filed: Aug. 21, 2008

(65) Prior Publication Data

US 2009/0075186 A1 Mar. 19, 2009

(30) Foreign Application Priority Data

Sep. 13, 2007 (KR) .................... 10-2007-0093262

(51) Int. Cl.
*G03F 9/00* (2006.01)
*G03C 5/00* (2006.01)

(52) U.S. Cl. ................... 430/5; 430/296; 430/331; 430/942

(58) Field of Classification Search .......... 430/5, 430/296, 331, 942
See application file for complete search history.

(56) References Cited

U.S. PATENT DOCUMENTS 4,670,372 A * 6/1987 Lewis et al. .............. 430/326
5,346,808 A * 9/1994 Jeffries, III ............... 430/296
5,585,223 A * 12/1996 Fréchet et al. ............ 430/296
5,783,495 A * 7/1998 Li et al. ..................... 438/738
6,107,009 A * 8/2000 Tan ........................... 430/331
6,200,736 B1 * 3/2001 Tan ........................... 430/319
6,479,820 B1 * 11/2002 Singh et al. ................. 850/9
6,933,247 B2 * 8/2005 Byun et al. ................. 438/781

FOREIGN PATENT DOCUMENTS

| JP | 2001-057334 | 2/2001 |
|---|---|---|
| JP | 2003-151895 | 5/2003 |
| KR | 1997-0012976 | 3/1997 |
| KR | 10-2002-0058440 | 7/2002 |

* cited by examiner

*Primary Examiner*—Christopher G Young
(74) *Attorney, Agent, or Firm*—Harness, Dickey & Pierce, PLC

(57) ABSTRACT

There is provided a method of manufacturing a photomask for forming a semiconductor pattern. The method may include forming a plurality of dies including a main pattern, and forming a pseudo pattern to an area adjacent to the main pattern between the plurality of dies. A multi developing process of sequentially and repeatedly supplying a developer on the mask, supplying DI water on the mask, and drying the mask may be performed in manufacturing the mask.

12 Claims, 8 Drawing Sheets

110a  120  110b

METHOD OF MANUFACTURING MASK

PRIORITY STATEMENT

This application claims the benefit of Korean Patent Application No. 10-2007-0093262, filed on Sep. 13, 2007, in the Korean Intellectual Property Office, the disclosure of which is incorporated herein in its entirety by reference.

BACKGROUND

1. Field

Example embodiments relate to a method of manufacturing a semiconductor device, and more particularly, to a method of manufacturing a photomask for forming a semiconductor pattern.

2. Description of the Related Art

As the minimum dimension of a semiconductor pattern decreases according to the design rule of micromachining, the uniformity of a critical dimension (CD) of a photomask becomes more and more important. Non-uniformity of the CD results from accuracy limits of photomask manufacturing equipments and variation of the density distribution in the semiconductor pattern. The non-uniformity of the CD resulting from the density distribution in the semiconductor pattern may be controlled by an electron beam through a fogging effect correction and proximity effect correction of an electron beam.

FIG. 1 is a plan view illustrating a portion of a conventional photomask.

Referring to FIG. 1, a plurality of dies is formed on a photomask 1. Each of the plurality of dies includes a main pattern. Meanwhile, an area without a pattern is between the plurality of dies, and, hereinafter, is referred to as a dividing area for convenience. For example, a dividing area 12 without a pattern is between a first die 11a and a second die 11b, and each of the first and second dies 11a, 11b on the photomask includes a main pattern.

FIG. 2 is a graph showing variations of width of CD in forming a main pattern of two dies adjacent to a dividing area.

In FIG. 2, the horizontal axis denotes a direction along a row of dies in a photomask, and the vertical axis denotes the width of a CD value of a main pattern formed on a die. "A" represents an area of the main pattern formed in the first die 11a adjacent to the dividing area 12, "B" represents the area of dividing area 12, and "C" represents an area of the main pattern formed in the second die 11b adjacent to the dividing area 12. The selected patterns of the two dies are within 1000 μm from the dividing area 12. Referring to FIG. 2, as the main pattern is close to the dividing area 12, variation of the width of the CD of the main pattern formed in dies, in a same batch of photomask developing, is relatively large.

FIG. 3 is a view showing a develop loading error of two adjacent dies on a conventional photamask FIG. 3 illustrates a CD of a main pattern, for example, a space pattern formed in the first die 11a and the second die 11b adjacent to the dividing area 12 after a development. The horizontal axis denotes a direction along a row of dies in a photomask, and the vertical axis denotes the width of the CD values of a main pattern formed on a die. As a distance from the dividing area 12 decreases, the CD of the space pattern formed in the first die 11a and the second die 11b increases. This is because the dividing area 12 does not have a space pattern, the equivalent average density of the space pattern in an area close to the dividing area 12 is lower than that of an area near the center of a die. Accordingly, a supplied developer may be consumed locally in a different rate near the dividing area 12 from that near the center of the die. The space pattern may be enlarged quicker near the dividing area 12 than the center of the die during a photomask development, resulting in a develop loading error of the space pattern. Such develop loading error increases sharply when the space pattern is within a first characteristic width W1 from the interface between the dividing area 12 and the die. Conventionally, W1 may be several hundreds of μm, and a develop loading error that increases at several hundreds μm away from the dividing area is referred to as a mid-local develop loading error.

SUMMARY

Example embodiments provide a method of manufacturing a mask to reduce and/or minimize a develop loading error.

According to an example embodiment, there is provided a method of manufacturing a mask. The method may include supplying a developer on a mask through reciprocation in a direction of the mask; supplying deionized (DI) water on the mask through reciprocation in the direction of the mask; and drying the mask, wherein the supplying of the developer, the supplying of the DI water, and the drying of the mask may be sequentially performed to develop the mask.

The developer and DI water may be supplied through a bar nozzle type dispenser, and the sequence of supplying the developer, DI water on the mask and drying the mask may be performed multiple times to develop the mask.

The method may further include rotating the mask simultaneously while supplying the DI water.

The drying of the mask may include rotating the mask.

According to an example embodiment, there is provided a method of manufacturing a mask. The method may include forming a plurality of dies including a main pattern on a mask; forming a pseudo pattern in an area adjacent to the main pattern between the plurality of dies on the mask.

The method may further include irradiating an electron beam on the mask to form at least one of the plurality of dies and the pseudo pattern.

The method may further include removing the pseudo pattern from the mask.

The pseudo patter may include a line and space pattern. The pseudo pattern may have a line width no larger than a blur size of an electron beam. The blur size of the electron beam may be 30 nm or less.

The irradiating of the electron beam on the mask may include irradiating the electron beam onto a chemical amplification resist on the mask.

According an example embodiment, there is provided a method of manufacturing a mask. The method may include forming a plurality of dies including a main pattern on a mask; forming a pseudo pattern in an area adjacent to the main pattern between the plurality of dies on the mask; supplying a developer on the mask through reciprocation in a direction of the mask; supplying deionized (DI) water on the mask through reciprocation in the direction of the mask; and drying the mask, wherein the supplying of the developer, the supplying of the DI water, and the drying of the mask may be sequentially performed multiple times to develop the mask.

The method may further include irradiating an electron beam on the mask to form at least one of the plurality of dies and the pseudo pattern.

The pseudo pattern may include a line and space pattern and may be removed from the mask.

The pseudo pattern may have a line width of a blur size of the electron beam or less, and the blur size of the electron beam may be 30 nm or less.

The developer and DI water may be supplied through a bar nozzle type dispenser.

The method may further include rotating the mask simultaneously while supplying the DI water, and the drying of the mask may include rotating the mask.

BRIEF DESCRIPTION OF THE DRAWINGS

The above and other features and advantages of example embodiments will become more apparent by describing in detail example embodiments thereof with reference to the attached drawings in which.

DETAILED DESCRIPTION OF EXAMPLE EMBODIMENTS

Figure 1:
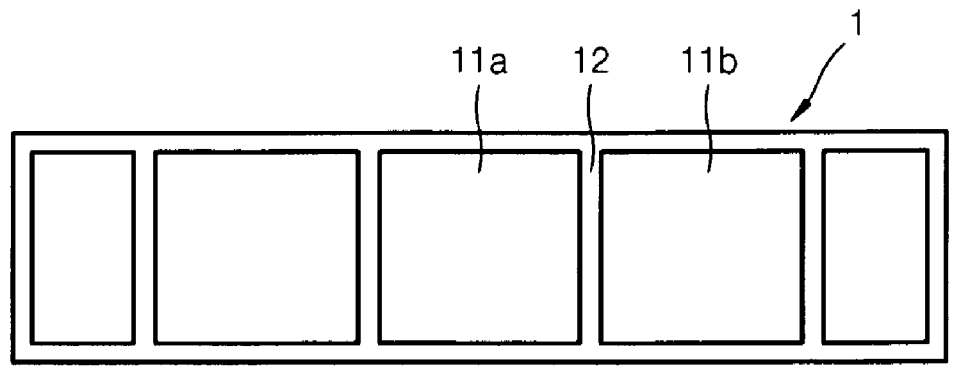
FIG. 1 is a plan view illustrating a portion of a conventional photomask.
Figure 2:
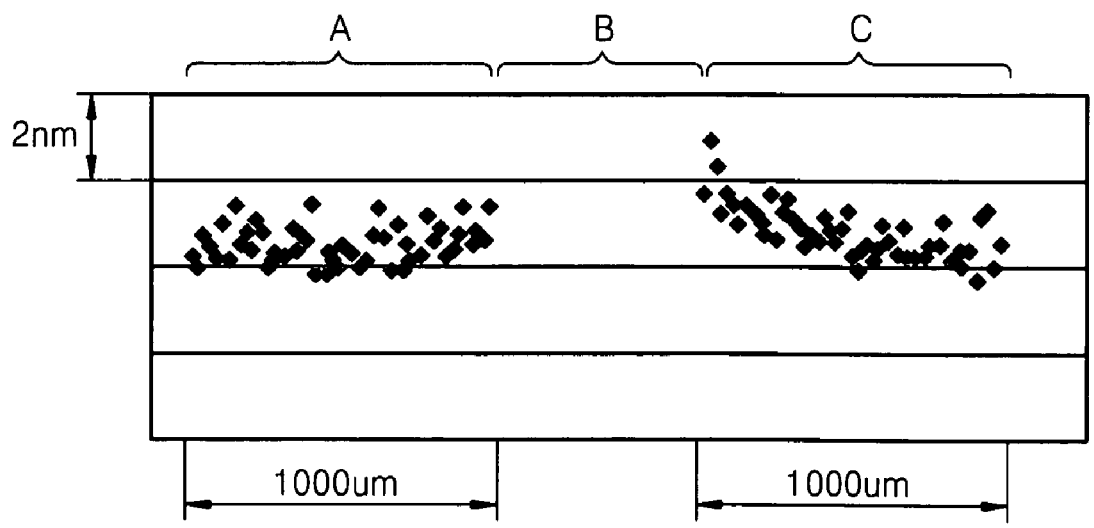
FIG. 2 illustrates variations of a CD of a main pattern formed in a die adjacent to a dividing area on a conventional photomask.
Figure 3:
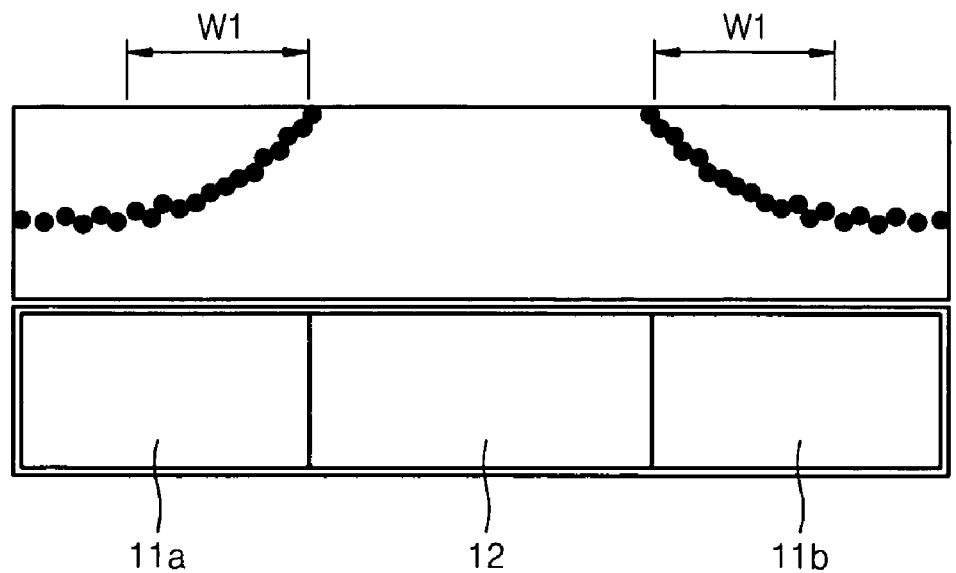
FIG. 3 is a view showing a develop loading error of two adjacent dies on a conventional photomask.

Example embodiments will now be described more fully with reference to the accompanying drawings, in which example embodiments are shown. Example embodiments may, however, be embodied in many different forms and should not be construed as being limited to the embodiments set forth herein; rather, example embodiments are provided so that this disclosure will be thorough and complete, and will fully convey the concept of the application to one skilled in the art.

In the drawings, the thicknesses of layers and regions are exaggerated for clarity. Like reference numerals in the drawings denote like elements throughout the specification and drawings. Relative terms, such as "lower" or "bottom" and "upper" or "top", may be used herein to describe one element's relationship to another elements as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The example term "lower", can therefore, encompass both an orientation of "lower" and "upper", depending of the particular orientation of the figure. Similarly, if the device in one of the figures is turned over, elements described as "below" or "beneath" other elements would then be oriented "above" the other elements. The example terms "below" or "beneath" can, therefore, encompass both an orientation of above and below.

Figure 4A:
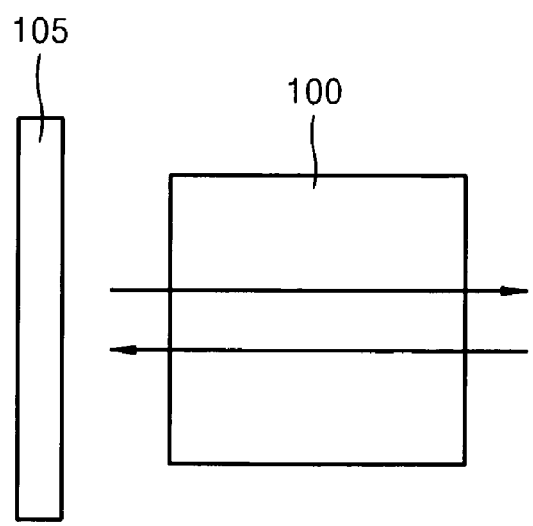
FIG. 4A illustrates a process of supplying a developer on a mask in a mask developing process, according to an example embodiment.
Figure 4B:
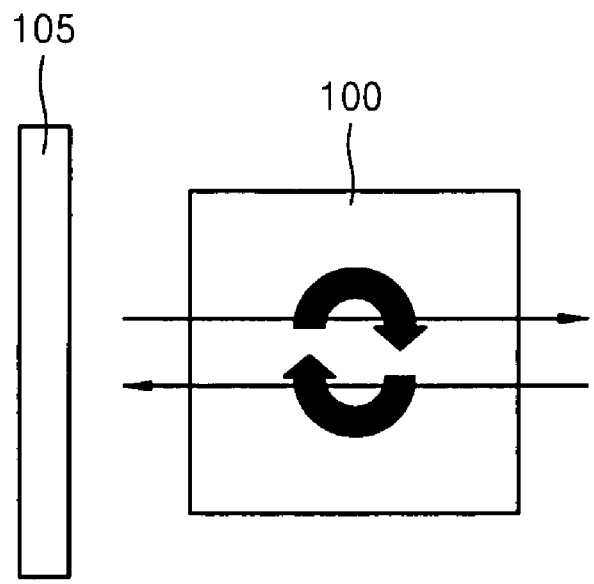
FIG. 4B illustrates a process of supplying deionized (DI) water on a mask in a mask developing process, according to an example embodiment.
Figure 4C:
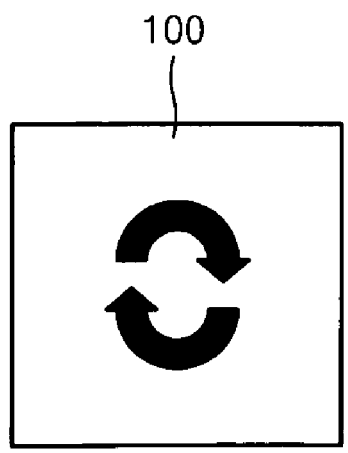
FIG. 4C illustrates a process of drying a mask in a mask developing process, according to an example embodiment.

FIGS. 4A through 4C are views sequentially illustrating a developing process of a mask according to example embodiments.

Referring to FIG. 4A, a dispenser 105 may supply a developer to a surface of a mask 100 while reciprocating in a direction of the mask 100. For example, the developer may include a Tetramethylammonium hydroxide (TMAH) solution and the developer may be injected onto the entire surface of an undeveloped mask 100. The reciprocation of the dispenser in the direction of the mask 100 may be a motion linearly scanning back and forth along a width directions denoted by the two arrows in FIG. 4A. The dispenser 105 may be a bar nozzle type dispenser.

Referring to FIG. 4B, the dispenser 105 may supply DI water onto a surface of a mask 100. For example, the DI water may be injected onto an entire surface of an undeveloped mask after supplying the developer to the undeveloped mask. The dispenser 105 may reciprocate in a direction of the undeveloped mask 100 to rinse the remaining developer. The rinsing effectiveness may be enhanced by rotating the undeveloped mask simultaneously while supplying the DI water. The reciprocation in the direction of the mask 100 refers to a motion linearly scanning back and forth along a width directions denoted by the two arrows in FIG. 4A. The dispenser 105 may be a bar nozzle type dispenser.

Referring to FIG. 4C, the mask 100 may be dried by rotating the mask 100 to remove the remaining DI water.

In a multi developing process according to example embodiments, a sequence of supplying the developer (FIG. 4A), the DI water (FIG. 4B), and drying the mask 100 may be performed multiple times. For example, the sequence may be repeated four times to perform the multi developing process.

Figure 5:
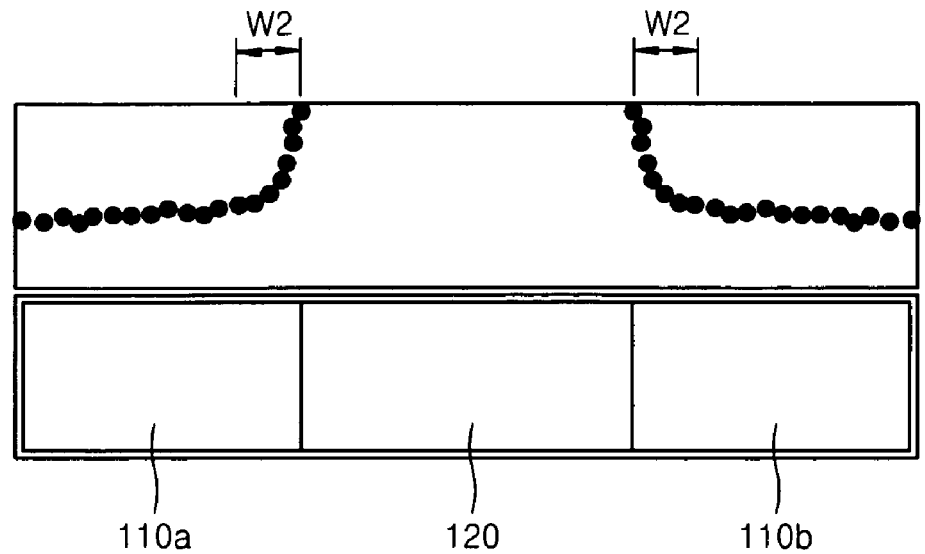
FIG. 5 is a view showing a develop loading error after a multi developing process according to an example embodiment.

FIG. 5 is a view showing a develop loading error after a multi developing process according to an example embodiment.

FIG. 5 shows a CD variation of a main pattern, for example, a space pattern, formed in a first die 110a and a second die 110b adjacent to a dividing area 120 after a multi developing process. Referring to FIG. 5, the CD value of the space pattern formed in the first and second dies 110a and 110b remains close to a constant value in areas near the center of the dies. The CD values increase sharply, and thus a develop loading error increases sharply, when the space pattern is within a second characteristic width W2 to an interface between the dividing area 120 and the dies 110a and 110b. This is because the dividing area 120 does not have a space pattern, the equivalent average density of the space pattern becomes lower for an area within the second characteristic width W2 to the interface of the dividing area 120 and the dies 110a, 110b, comparing to the space pattern density in the center of dies 110a. Thus, a supplied developer may be consumed locally at a different rate near the dividing area 120 than near the center of the dies, resulting in a develop loading error of the space pattern. However, the second characteristic width W2 may be reduced to several tens of μm by applying the multi developing process in the mask developing procedure, according to example embodiments, while the first width W1 of a mid-local develop loading error is several hundreds of μm. The develop loading error that increases sharply at several tens of μm from the dividing area is referred to as a short-range develop loading error. Therefore, the multi developing process according to example embodiments may reduce the develop loading error from a conventional mid-local develop loading error to a short-range develop loading error.

Figure 6A:
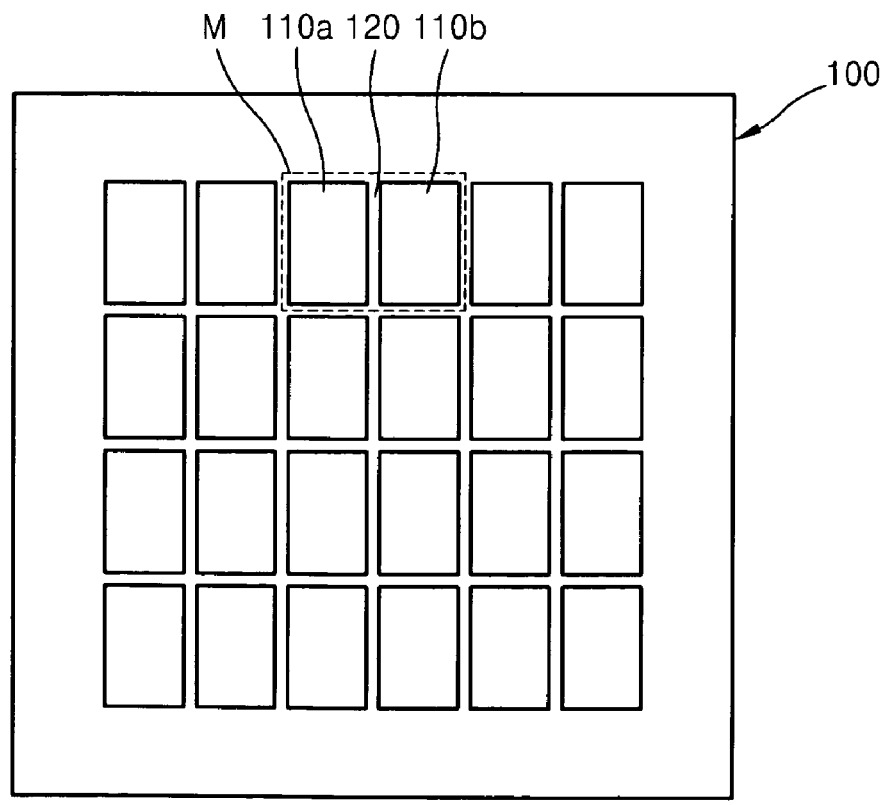
FIG. 6A is a view illustrating an area M on a mask where a develop loading error is measured.
Figure 6B:
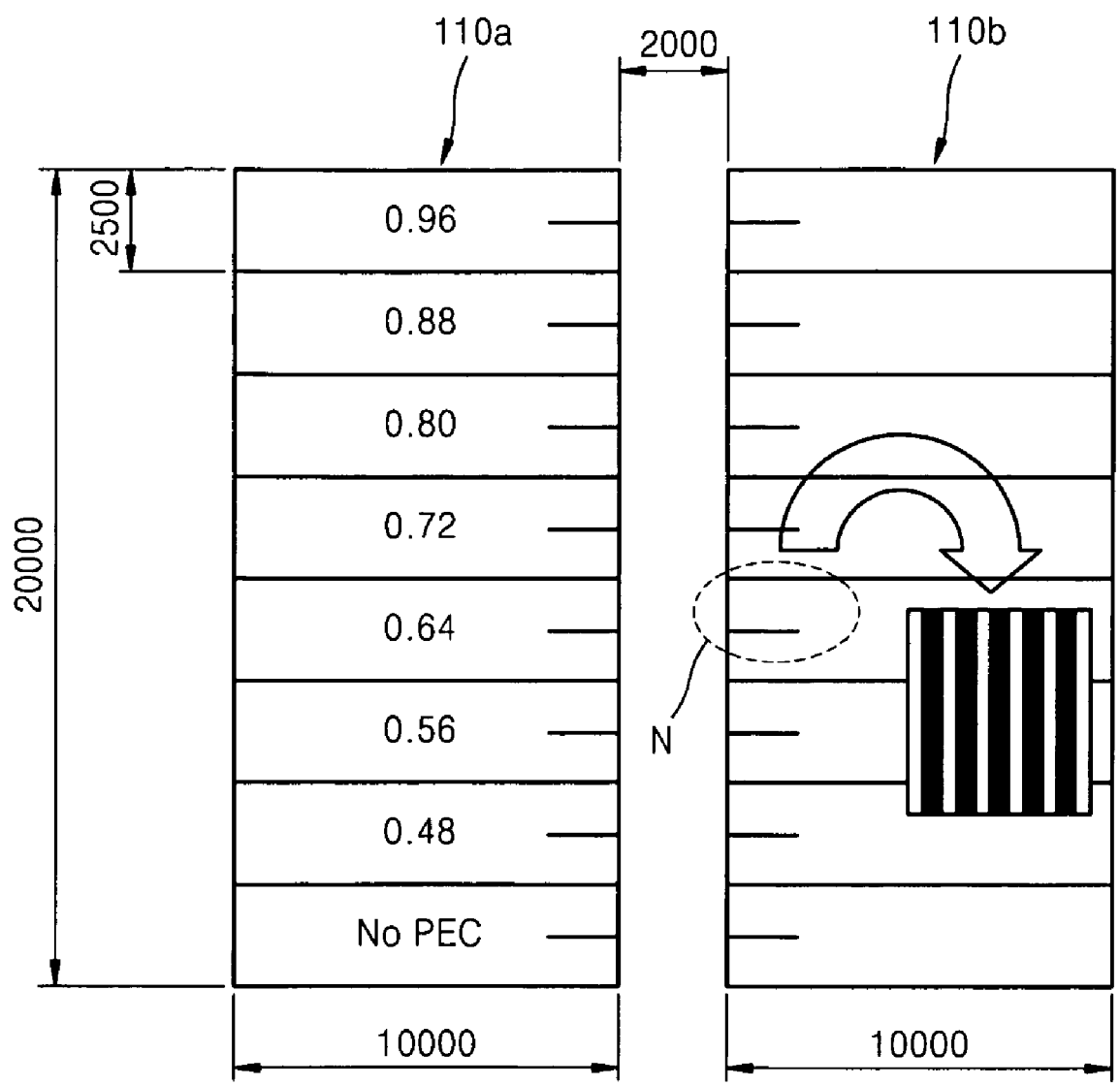
FIG. 6B is a view microscopically illustrating an area N in the area M, where a develop loading error corresponding to a particular eta value of an electron beam is measured.
Figure 6C:
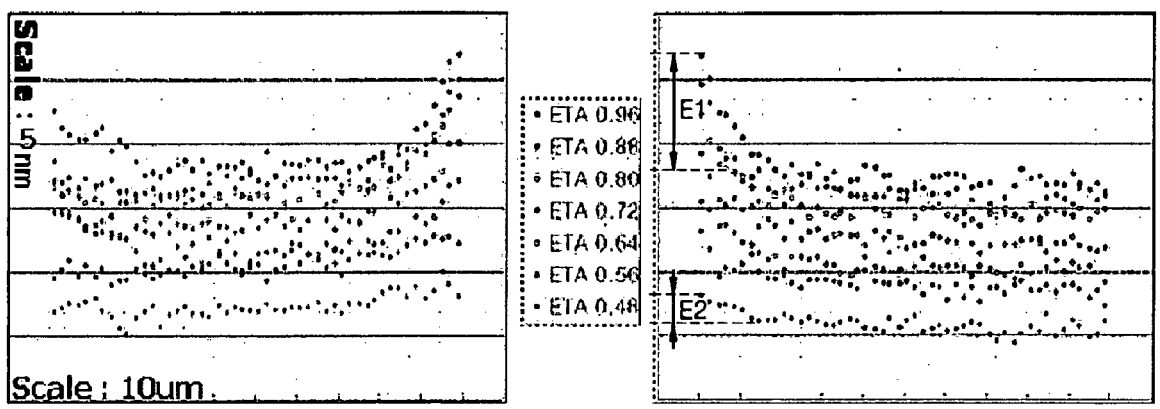
FIG. 6C is a graph showing measurement results of develop loading errors in the area N corresponding to various eta values of an electron beam applied to the mask.

FIGS. 6A through 6C are views related to an experiment measuring a develop loading error depending on an eta value of an electron beam. The eta (η) value of an electron beam is a factor that adjusts the intensity of an electron beam irradiated on the mask 100 depending on change in the pattern density. In detail, FIG. 6A is a view illustrating an area M on a mask, where a develop loading error is measured, FIG. 6B is a view microscopically illustrating an area N in the area M, where a develop loading error corresponding to a particular eta value is measured, and FIG. 6C is a graph showing measurement results of develop loading errors in the area N corresponding to various eta values of an electron beam applied to the mask.

Referring to FIG. 6A, a plurality of dies including a main pattern are disposed on a mask 100. For example, a first die 110a and a second die 110b are disposed adjacent to a dividing area 120. An area M includes the first die 110a and the second die 110b. Develop loading errors in the area M associated with various eta values of an electron beam are measured after performing a multi developing process.

Referring to FIG. 6B, an eta value of an electron beam is split and an electron beam is irradiated to the first and second dies 110a and 110b. Next, the develop loading error associated with each eta value is measured. In the experiment, the eta value of the electron beam applied to the mask ranges from 0.48 to 0.96. The dimension of numeral values shown in FIG. 6B is μm. For each eta value, a CD of a main pattern, for example, a space pattern, is measured in the first and second dies 110a and 110b adjacent to the dividing area 120. The amplified view shown below the arrow in FIG. 6B illustrates the CD of a main pattern in the area N of the second die 110b. The eta value of an electron beam to produce this main pattern is 0.64. In FIG. 6B, the example pattern shown in the area N is configured as a line and space pattern, when it is enlarged.

In FIG. 6C, the left graph shows a CD of the space pattern measured in the first die 110a adjacent to the dividing area 120, and the right graph shows a CD of the space pattern measured in the second die 110b adjacent to the dividing area 120. Referring to FIG. 6C, as a distance from the dividing area 120 decreases, the CD of the space pattern becomes larger, and thus generate a width difference between the space pattern close to the center of a die and the space pattern close to the dividing area. For example, the width difference of the CD when eta value is 0.96 is E1, according to FIG. 6C. The width difference of CD also increases with the increase of the eta value of the electron beam. For example, a width difference E1 of the CD when eta value is 0.96 is larger than a width difference E2 of the CD when the eta value is 0.48. Therefore, the loading error after a multi developing process may be reduced and/or minimized by carefully selecting a particular eta value of the electron beam. However, other important factors as well as the eta value of the electron beam should be considered, and the split eta value of the electron beam cannot be applied to a substantial mask fabrication. For example, 0.48 of the eta value of the electron beam may not be applied in order to reduce and/or minimize the develop loading error adjacent to the dividing area 120, when the eta value of the electron beam applied to a main pattern is 0.72. Accordingly, a pseudo pattern may be adopted alternatively in forming the main pattern of a die on a mask for width difference reduction.

This alternative method may have equivalent effect of an electron beam with particular eta value (0.48, for example), according to an example embodiment.

Figure 7A:
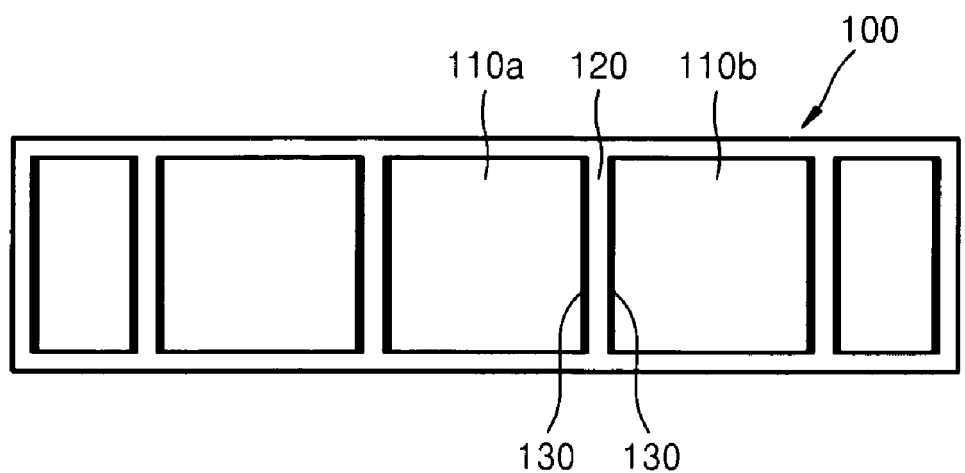
FIG. 7A is a plan view illustrating a portion of a mask according to an example embodiment.
Figure 7B:
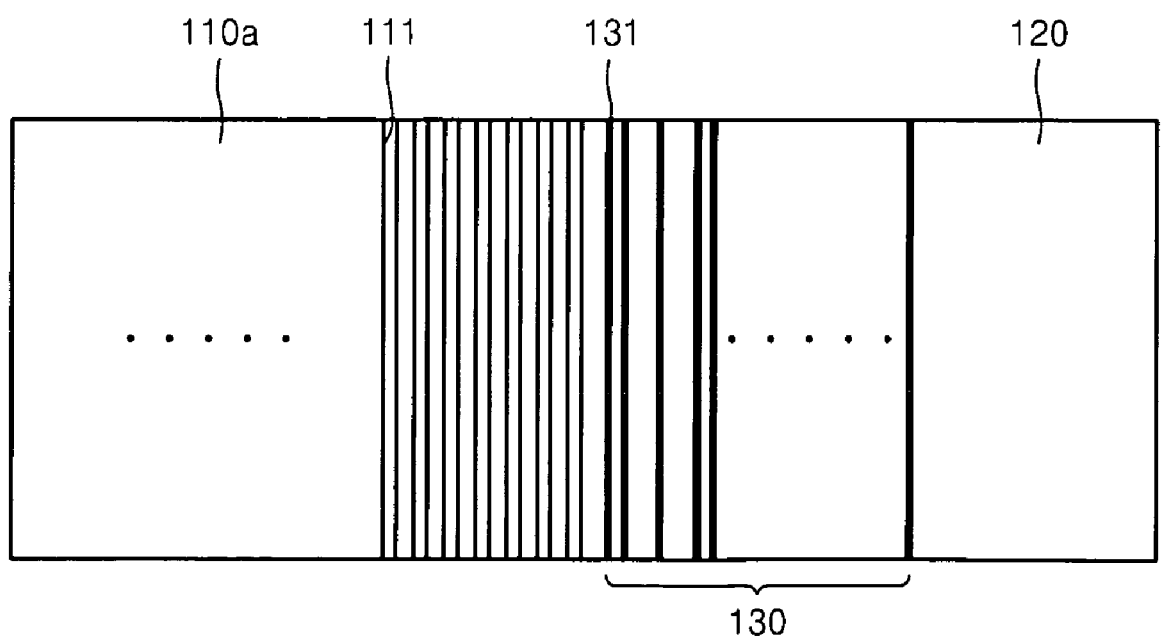
FIG. 7B is a plan view illustrating a pseudo pattern applied between a die and a dividing area.

FIG. 7A is a plan view illustrating a portion of a mask according to an example embodiment. FIG. 7B is a plan view illustrating a pseudo pattern applied between a die and a dividing area.

Referring to FIG. 7A, a plurality of dies may be formed on a mask 100. The plurality of dies may include a main pattern. A dividing area 120 without a pattern may be between the plurality of dies. For example, the dividing area 120 without a pattern may be between a first die 110a and a second die 110b including a main pattern. A pseudo pattern 130 may be applied to an interface between the dividing area 120 and the first and second dies 110a and 110b in the dividing area 120.

Referring to FIG. 7B, a main pattern configured as a line and space pattern 111 is formed in the first die 110a. The pseudo pattern 130 is applied between the dividing area 120 and the adjacent die 110a. The pseudo pattern 130 may include a line and space pattern 131. The pseudo pattern 130 may be formed on the mask 100 by irradiation of an electron beam onto a chemical amplification resist on the mask. A line width of the pseudo pattern 130 may be a blur size of an electron beam or less than a blur size of an electron beam, so that the pseudo pattern may be removed during the mask development or etching. For example, the line width of the blur size may be 30 nm or less, so that the pseudo pattern may be removed by a developer during developing a mask.

Figure 8:
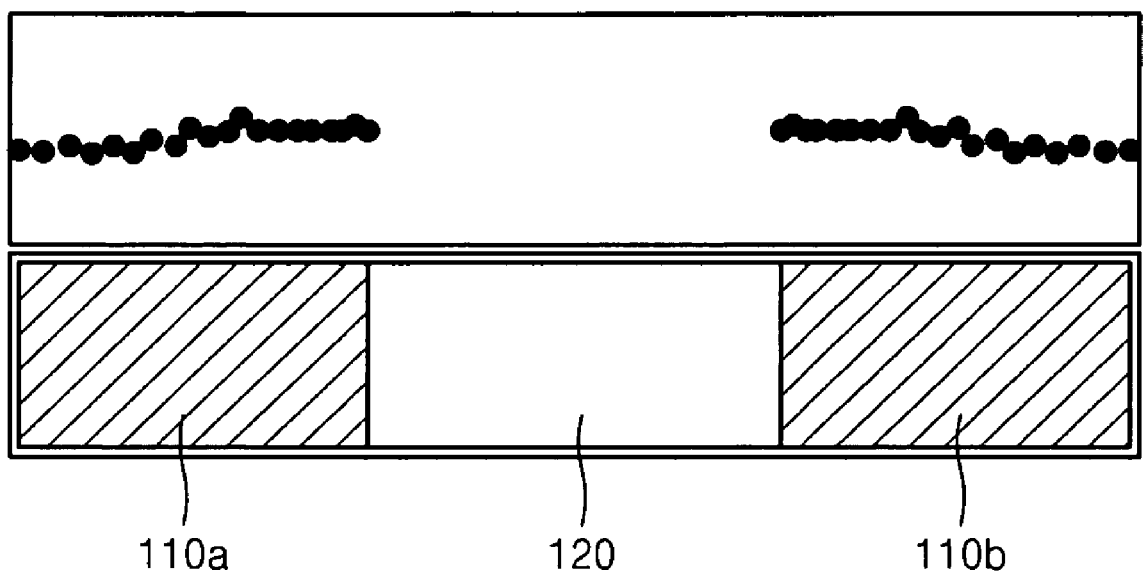
FIG. 8 is a view showing a develop loading error after applying a multi developing process and a pseudo pattern to a mask according to an example embodiment.

FIG. 8 is a view showing a develop loading error after applying a pseudo pattern and a multi developing process to a mask, according to example embodiments. A CD of the main pattern (for example, the space pattern) is formed and measured in the first and second dies 110a, 110b adjacent to the dividing area 120. When the pseudo pattern and multi developing process are applied, the width of the CD of the main pattern is close to a constant and has only small variations across the die. Therefore, the increase of the develop loading error near the dividing area may be reduced and/or prevented by applying the pseudo pattern and performing the multi developing process, according to example embodiments.

According to a method of manufacturing a mask of example embodiments, a develop loading error may be reduced and/or minimized. While example embodiments have been particularly shown and described with reference to FIGS. 4-8, it will be understood by those of ordinary skill in the art that various changes in form and details may be made therein without departing from the spirit and scope of example embodiments as defined by the following claims.

What is claimed is:

1. A method of manufacturing a mask, the method comprising:
   forming a plurality of dies including a main pattern on the mask; and
   forming a photoresist pseudo pattern in an area adjacent to the main pattern between the plurality of dies on the mask using electron beam irradiation, the pseudo pattern sized so that the pseudo pattern is removed during developing or etching of the mask.

2. The method of claim 1, wherein the pseudo pattern is configured as a line and space pattern.

3. The method of claim 1, wherein the pseudo pattern has a line width no larger than a blur size of an electron beam.

4. The method of claim 3, wherein the blur size of the electron beam is 30 nm or less.

5. The method of claim 1, wherein the electron beam irradiation includes irradiating a chemically amplified resist on the mask.

6. A method of manufacturing a mask, the method comprising:
- forming a plurality of dies including a main pattern on the mask;
- forming a photoresist pseudo pattern in an area adjacent to the main pattern between the plurality of dies on the mask using electron beam irradiation; and
- developing the mask, the developing of the mask including supplying a developer onto the mask through reciprocation in a direction of the mask, supplying a deionized (DI) water onto the mask through reciprocation in the direction of the mask, and drying the first mask,
- wherein the supplying of the developer, the supplying of the DI water, and the drying of the mask are sequentially performed multiple times, and
- the pseudo pattern is sized so that the pseudo pattern is removed during the developing of the mask or etching of the mask.

7. The method of claim 6, wherein the pseudo pattern includes a line and space pattern.

8. The method of claim 6, wherein the pseudo pattern has a line width no larger than a blur size of the electron beam.

9. The method of claim 8, wherein the blur size of the electron beam is 30 nm or less.

10. The method of claim 6, wherein the developer and DI water are supplied through a bar nozzle type dispenser.

11. The method of claim 6, further comprising:
- rotating the mask simultaneously while supplying the DI water.

12. The method of claim 6, wherein the drying of the mask includes rotating the mask.

* * * * *